(12) United States Patent
Lee et al.

(10) Patent No.: US 7,696,105 B2
(45) Date of Patent: Apr. 13, 2010

(54) METHOD FOR PRODUCING CATALYST-FREE SINGLE CRYSTAL SILICON NANOWIRES, NANOWIRES PRODUCED BY THE METHOD AND NANODEVICE COMPRISING THE NANOWIRES

(75) Inventors: Eun Kyung Lee, Suwon-si (KR);
Dongmock Whang, Suwon-si (KR);
Byoung Lyong Choi, Seoul (KR);
Byung Sung Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 55 days.

(21) Appl. No.: 12/128,362

(22) Filed: May 28, 2008

(65) Prior Publication Data
US 2009/0152527 A1    Jun. 18, 2009

(30) Foreign Application Priority Data
Dec. 13, 2007    (KR) ....................... 10-2007-0129907

(51) Int. Cl.
*H01L 21/461* (2006.01)
(52) U.S. Cl. ................... 438/753; 977/762; 977/890; 977/891; 977/892; 977/893
(58) Field of Classification Search ................. 438/753; 977/762, 890, 891, 892, 893; 117/87
See application file for complete search history.

(56) References Cited

U.S. PATENT DOCUMENTS 4,848,295 A    7/1989    Loran et al.

FOREIGN PATENT DOCUMENTS

| JP | 2004296750 | 10/2004 |
|----|------------|---------|
| JP | 2005112701 | 4/2005 |
| KR | 1020070036499 | 4/2007 |
| KR | 1020070052562 | 5/2007 |

OTHER PUBLICATIONS

"A growth mechanism of Si nanowires synthesized by gas condensation of SiO without any catalyst" Jianfeng et al., Journal of Crystal Growth (2004), vol. 269, pp. 207-212.*

* cited by examiner

*Primary Examiner*—Thao X Le
*Assistant Examiner*—Geoffrey Ida
(74) *Attorney, Agent, or Firm*—Cantor Colburn LLP

(57) ABSTRACT

Disclosed herein is a method for producing catalyst-free single crystal silicon nanowires. According to the method, nanowires can be produced in a simple and economical manner without the use of any metal catalyst. In addition, impurities contained in a metal catalyst can be prevented from being introduced into the nanowires, contributing to an improvement in the electrical and optical properties of the nanowires. Also disclosed herein are nanowires produced by the method and nanodevice comprising the nanowires.

7 Claims, 6 Drawing Sheets

METHOD FOR PRODUCING CATALYST-FREE SINGLE CRYSTAL SILICON NANOWIRES, NANOWIRES PRODUCED BY THE METHOD AND NANODEVICE COMPRISING THE NANOWIRES

PRIORITY STATEMENT

This application claims priority under U.S.C. §119 to Korean Patent Application No. 10-2007-0129907, filed on Dec. 13, 2007, in the Korean Intellectual Property Office (KIPO), the entire contents of which are incorporated herein by reference.

BACKGROUND

1. Field of the Invention

Example embodiments relate to a method for producing catalyst-free single crystal silicon nanowires, nanowires produced by the method, and nanodevice comprising the nanowires. More specifically, the method is directed to the production of catalyst-free single crystal silicon nanowires with improved electrical and optical properties by which nanowires are produced without the use of any metal catalyst so that impurities contained in a metal catalyst can be prevented from being introduced into the nanowires.

2. Description of the Related Art

Nanowires are linear materials whose diameter is in the nanometer range and whose length is several hundred nanometers or on the order of micrometers or millimeters. Nanowires exhibit various physical properties depending on their diameter and length. Nanowires can find various applications in highly integrated devices due to their small size, and offer advantages in that electron mobility characteristics in particular directions and optical properties, such as polarization, inherent to nanowires can be utilized.

Particularly, silicon nanowires function as conducting lines connecting nanodevices and their inherent characteristics (e.g., electrical properties) are controlled by doping and a thickness variation to function as basic constituents of nanodevices. Based on these functions, silicon nanowires find application in various fields, including photonic nanodevices, electronic nanodevices and nanosensors.

SUMMARY

Disclosed herein is a method for producing nanowires with improved electrical and optical properties, which comprises wet etching the surface of a silicon substrate to leave defect sites, exposing the wet-etched silicon substrate to deionized water or air to form an oxide layer thereon, and heating the resulting silicon substrate in a furnace while feeding a nanowire precursor into the furnace to grow silicon nanowires from silicon nuclei formed within the oxide layer. According to the method, nanowires are produced without the use of any metal catalyst so that the need for the purification of a catalyst can be eliminated, which contributes to the improvement of economic efficiency. In addition, impurities contained in a metal catalyst can be prevented from being introduced into the nanowires, which contributes to an improvement in the electrical and optical properties of the nanowires.

Disclosed herein too are catalyst-free single crystal silicon nanowires produced by the method. The silicon nanowires can be applied to various nanodevices due to their stabilized electrical and optical properties.

Disclosed herein too is a nanodevice comprising the silicon nanowires.

BRIEF DESCRIPTION OF THE DRAWINGS

Example embodiments will be more clearly understood from the following detailed description taken in conjunction with the accompanying drawings, in which.

DETAILED DESCRIPTION OF EXAMPLE EMBODIMENTS

Hereinafter, a detailed description will be given of example embodiments with reference to the accompanying drawings.

It will be understood that when an element or layer is referred to as being "on," "interposed," "disposed," or "between" another element or layer, it can be directly on, interposed, disposed, or between the other element or layer or intervening elements or layers may be present.

It will be understood that, although the terms first, second, third, and the like may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, first element, component, region, layer or section discussed below could be termed second element, component, region, layer or section without departing from the teachings of the present invention.

As used herein, the singular forms "a," "an" and "the" are intended to comprise the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

According to one embodiment, a method for producing nanowires with improved electrical and optical properties is provided wherein the method comprises wet etching the surface of a silicon substrate to leave defect sites, exposing the wet-etched silicon substrate to deionized water or air to form an oxide layer thereon, and heating the resulting silicon substrate in a furnace while feeding a nanowire precursor into the furnace to grow silicon nanowires from silicon nuclei formed within the oxide layer.

The oxide layer may contain $SiO_x$ (0<x<2).

Figure 1:
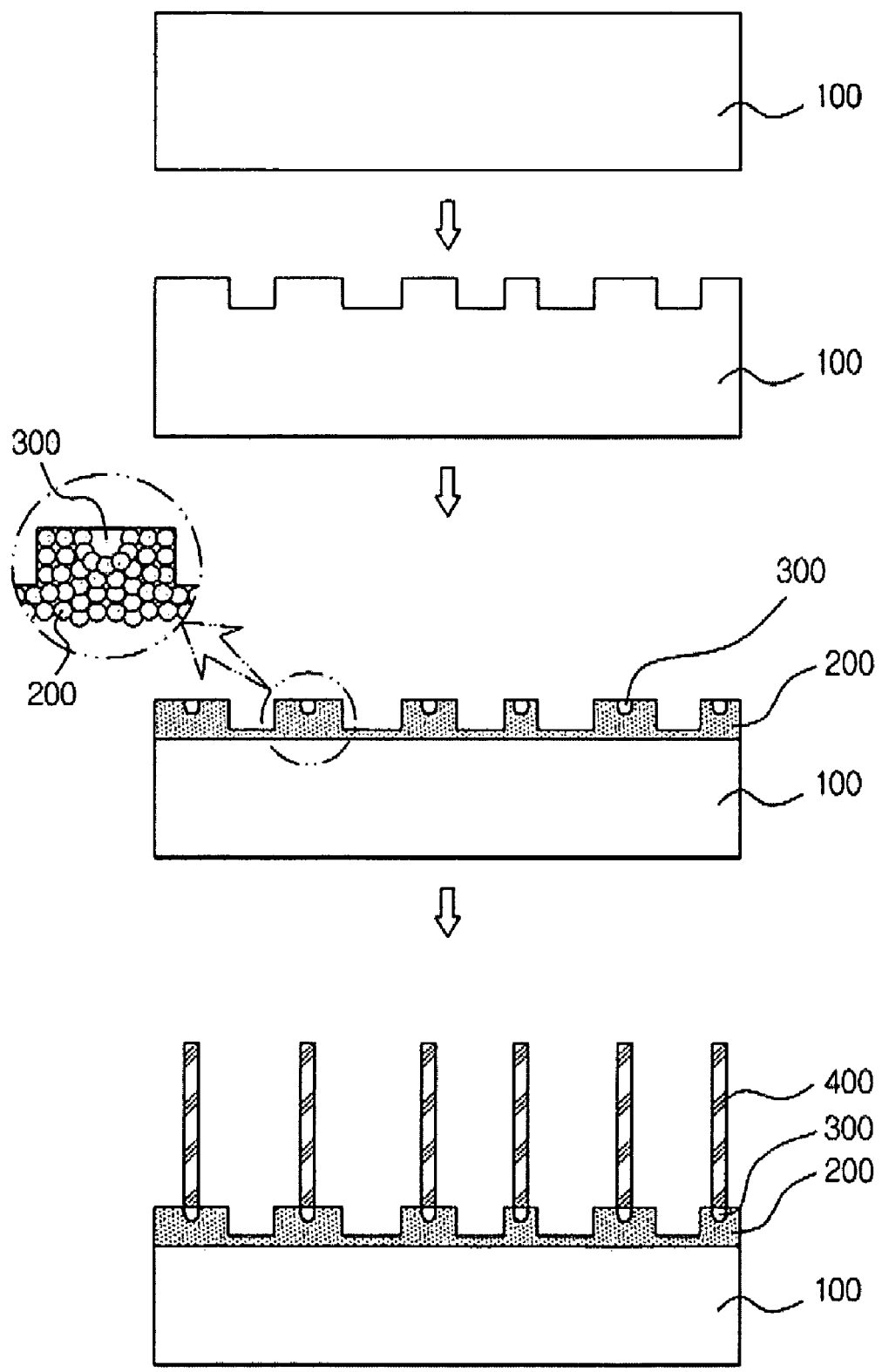
FIG. 1 shows exemplary process flow diagrams illustrating a method for producing catalyst-free single crystal silicon nanowires.

FIG. 1 shows exemplary process flow diagrams illustrating the method. First, the surface of a silicon substrate 100 is wet-etched to leave defect sites. The substrate may be cleaned by suitable known processes before wet etching to remove impurities contained therein.

Examples of suitable etching solutions for the wet etching include, but are not necessarily limited to, NaOH solutions, aqueous acetic acid solutions, aqueous hydrofluoric acid solutions, and aqueous phosphoric acid solutions.

Subsequently, the wet-etched silicon substrate 100 is exposed to deionized (DI) water or air to form an oxide layer 200 thereon. The oxide layer contains $SiO_x$ (0<x<2) rich in silicon (Si).

Long-term exposure causes an excessive oxidation of the etched silicon substrate to increase the possibility that the oxide layer will contain $SiO_2$ rather than $SiO_x$ (0<x<2). Thus, the exposure time is preferably limited to 10 minutes to one hour. It is preferred that the thickness of the oxide layer be not larger than 2 nm.

Then, the resulting silicon substrate 100 is heated in a furnace while feeding a nanowire precursor into the furnace to grow silicon nanowires 400 from silicon nuclei 300 formed within the oxide layer 200.

The defect sites of the silicon substrate cause the silicon atoms to migrate to high-surface energy regions of the silicon substrate to form silicon-rich areas within the oxide layer 200. The silicon-rich areas function as silicon nuclei 300 from which silicon nanowires grow.

The nanowire precursor may be selected from the group consisting of $SiH_4$, $SiCl_4$, $SiH_2Cl_2$ and mixtures thereof, but is not necessarily limited thereto.

The heating is preferably conducted at a temperature of about 400° C. to about 800° C. A eutectic alloy of a metal catalyst (e.g., Au) and silicon is difficult to form at a temperature lower than 400° C. Meanwhile, a high temperature exceeding 800° C. makes it difficult to apply the method to the fabrication of devices. The heating time may vary depending on the length of nanowires to be produced.

The nanowires may be doped with an n-dopant or p-dopant during the production of the nanowires. For example, $B_2H_6$ can be fed together with $SiH_4$ as the nanowire precursor to grow p-doped nanowires.

n- and p-type doping regions may be formed in the nanowires during growth of the nanowires to allow the nanowires to have a p-n junction structure. The nanowires having a p-n junction structure are suitable for use in the fabrication of light-emitting devices.

In accordance with another embodiment, there are provided catalyst-free silicon single crystal nanowires produced by the method.

The nanowires may have a diameter of about 2 nm to about 200 nm and a length of about 10 nm to about 1,000 μm, but are not necessarily limited to these dimensions. The dimension of the nanowires is determined taking into consideration the operation and integration of nanodevices using the nanowires.

In accordance with yet another embodiment, there is provided a nanodevice comprising the nanowires.

The nanodevice is not particularly limited, and examples thereof include transistors, light-emitting devices, light-receiving devices, sensors, photodetectors, light-emitting diodes, laser diodes, electroluminescent (EL) devices, photoluminescent (PL) devices and cathodoluminescent (CL) devices.

A better understanding of exemplary embodiments will be described in more detail with reference to the following examples. However, these examples are given for the purpose of illustration merely and are not to be construed as limiting the scope of the embodiments.

EXAMPLES

Example 1

Production of Catalyst-Free Single Crystal Silicon Nanowires

First, a silicon substrate was sequentially cleaned with an aqueous sulfuric acid solution, acetone, isopropyl alcohol and deionized water. The surface of the cleaned silicon substrate was wet-etched with a NaOH solution to leave defect sites. Subsequently, the wet-etched silicon substrate was exposed to air for one hour to form an oxide layer thereon.

Figure 2:
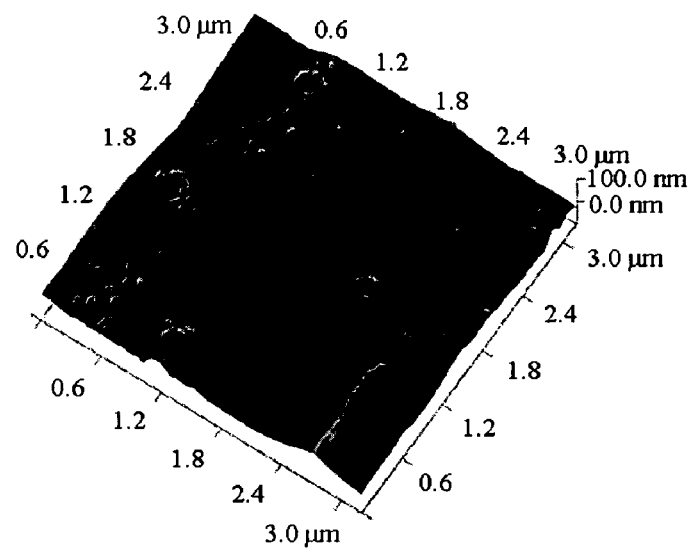
FIG. 2 is an atomic force microscopy (AFM) image showing the surface of a silicon substrate on which a $SiO_x$ layer was formed in Example 1.

The surface of the resulting silicon substrate was observed under an atomic force microscope (AFM). The image is shown in FIG. 2. The image shows that the defect sites were not uniformly formed on the surface of the silicon substrate and the oxide layer was formed thereon.

Figure 3:
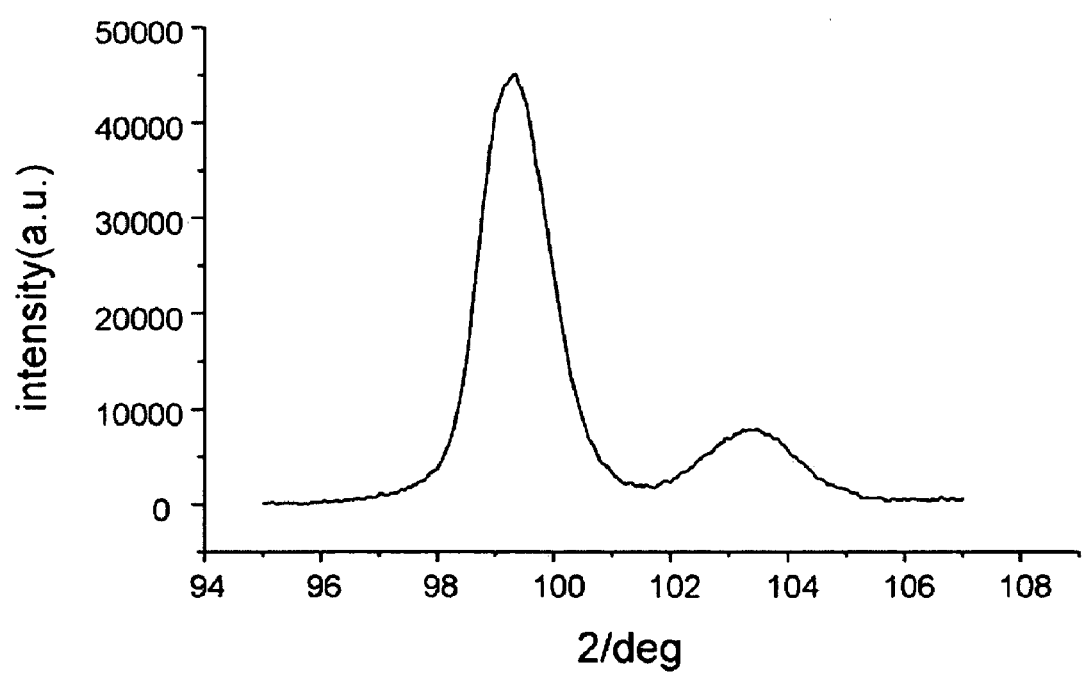
FIG. 3 is an X-ray photoelectron spectroscopy (XPS) spectrum showing the binding energy of silicon (Si) within an oxide layer formed on a silicon substrate in Example 1.

FIG. 3 is an X-ray photoelectron spectroscopy (XPS) spectrum showing the binding energy of silicon (Si) within the oxide layer formed on the silicon substrate. Two peaks (99.5 and 103.7 eV) representing higher Si contents within the oxide layer were observed in the spectrum.

Thereafter, the resulting silicon substrate was placed in a furnace and heated at a rate of 10° C./min. Argon and $SiH_4$ as a nanowire precursor were sequentially fed into the furnace at flow rates of about 100 sccm and about 4 sccm, respectively, while maintaining the processing pressure of the furnace at 100 torr.

The temperature of the furnace was kept at a processing temperature of 535° C. for 30 minutes to allow silicon nanowires to grow on the oxide layer. Then, the furnace was slowly cooled to room temperature to stop the growth of the silicon nanowires.

Figure 4A:
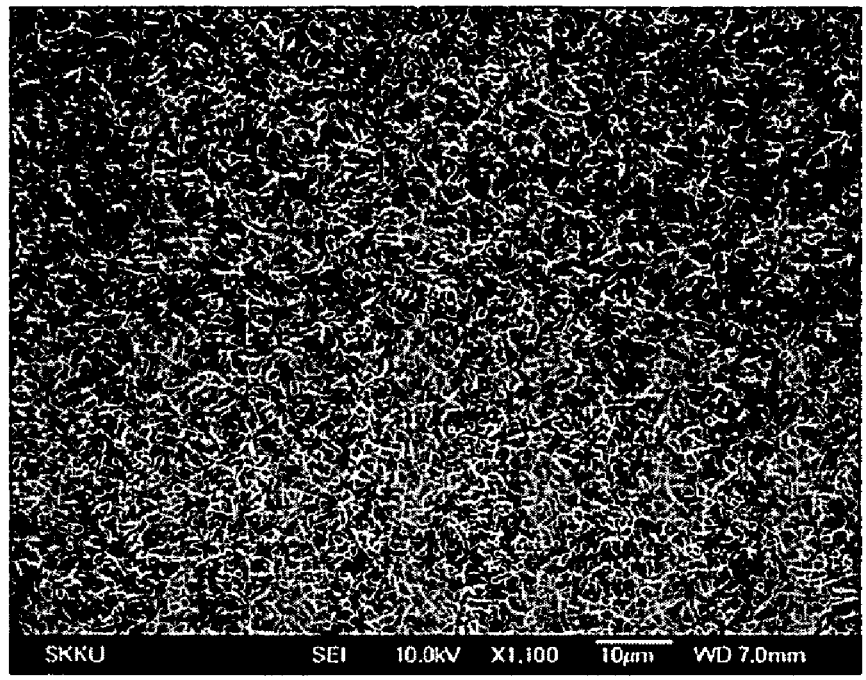
FIGS. 4a and 4b are scanning electron microscopy (SEM) images of catalyst-free single crystal silicon nanowires produced in Example 1.
Figure 4B:
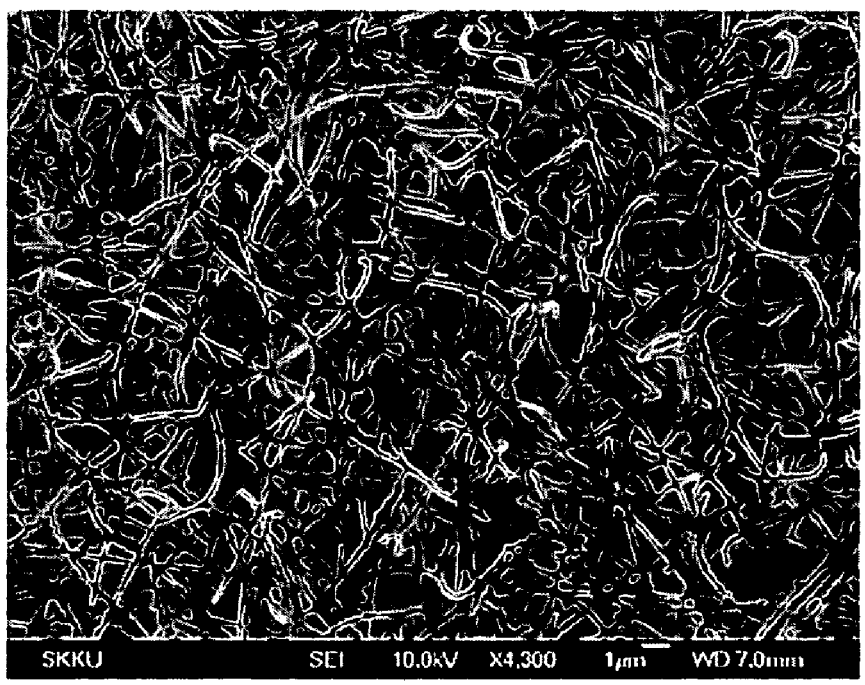

FIGS. 4a and 4b are scanning electron microscopy (SEM) images of the silicon nanowires.

Figure 6A:
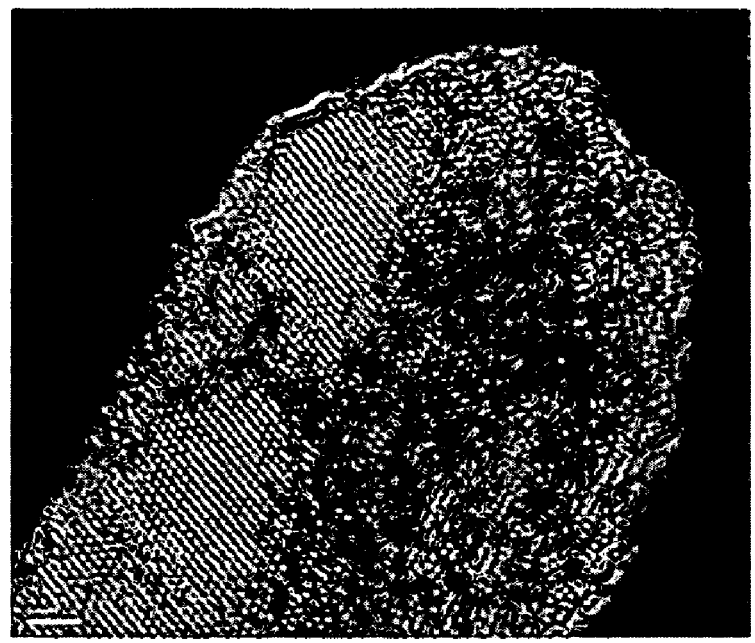
FIGS. 6a and 6b are transmission electron microscopy (TEM) images of one of catalyst-free single crystal silicon nanowires produced in Example 1.
Figure 6B:
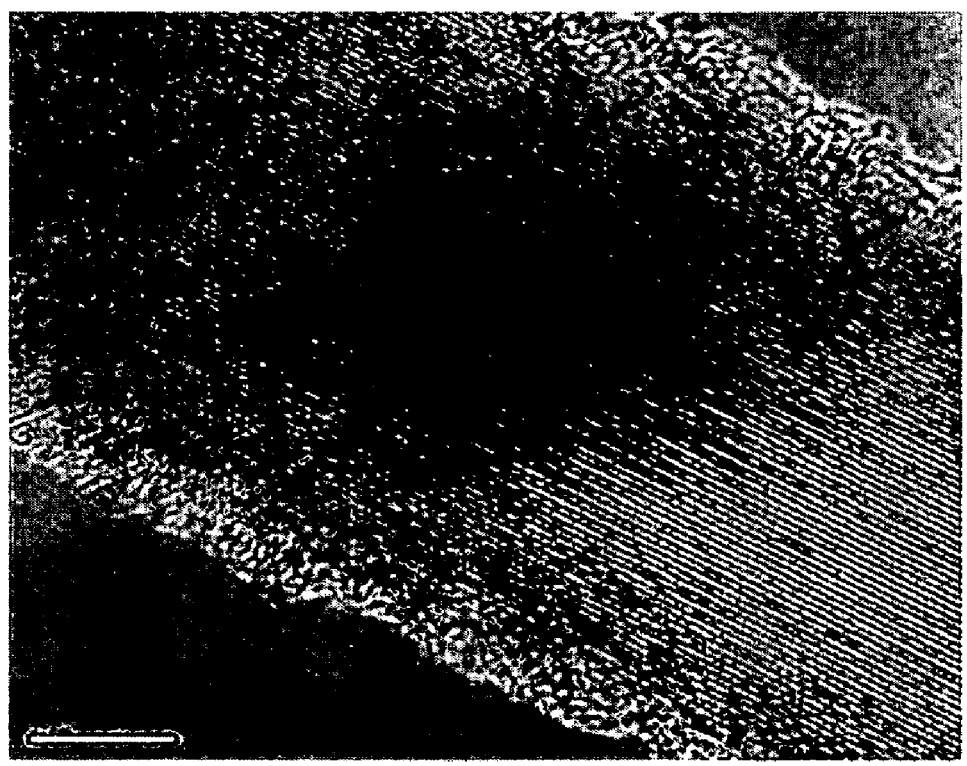

FIGS. 6a and 6b are transmission electron microscopy (TEM) images of one of the silicon nanowires. Specifically, FIGS. 6a and 6b show tip and middle portions of the nanowire, respectively.

Figure 7:
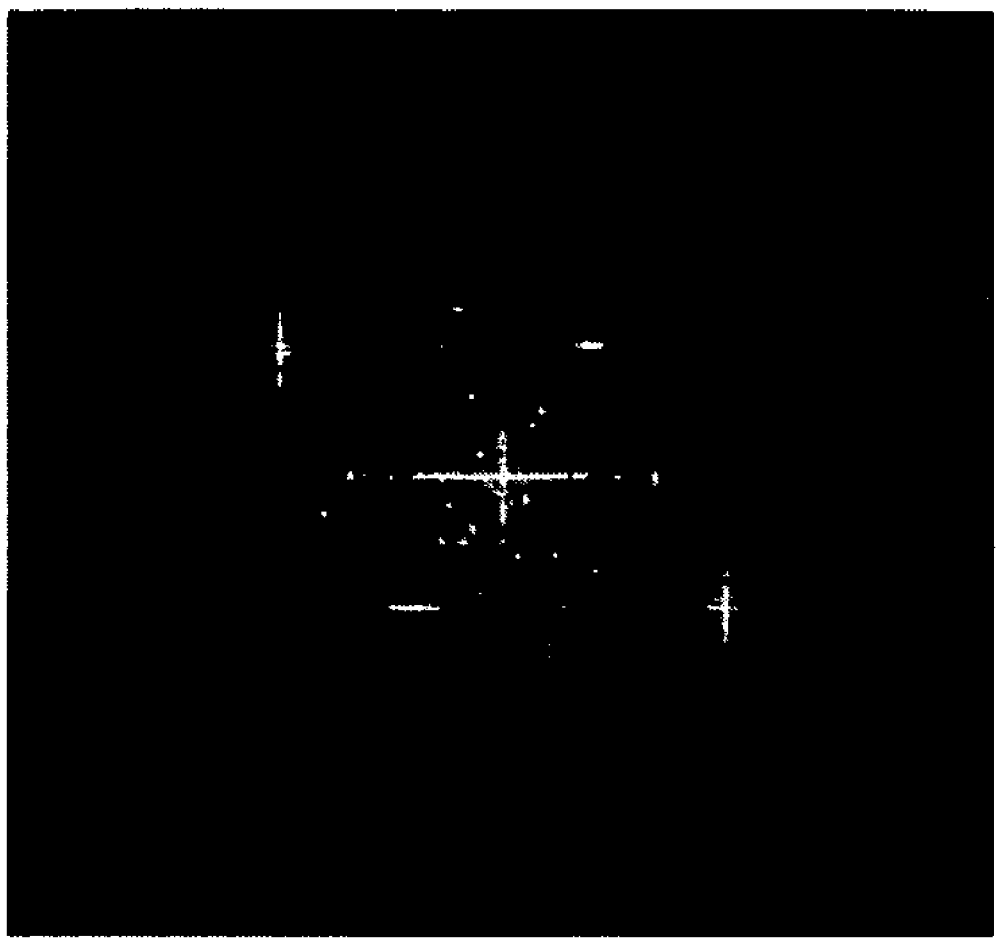
FIG. 7 is a transmission electron diffraction pattern of catalyst-free single crystal silicon nanowires produced in Example 1.

FIG. 7 is a transmission electron diffraction pattern of the silicon nanowires. This pattern demonstrates that the nanowires were single crystalline.

Example 2

Production of Catalyst-Free Single Crystal Silicon Nanowires

Silicon nanowires were produced in the same manner as in Example 1 except that the processing temperature was adjusted to 620° C.

Figure 5A:
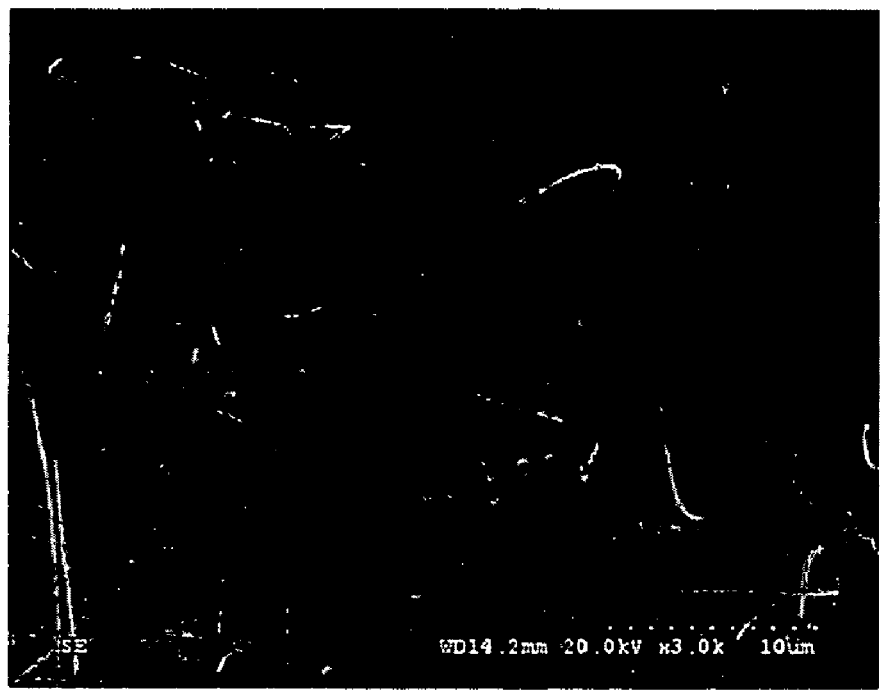
FIGS. 5a and 5b are scanning electron microscopy (SEM) images of catalyst-free single crystal silicon nanowires produced in Example 2.
Figure 5B:
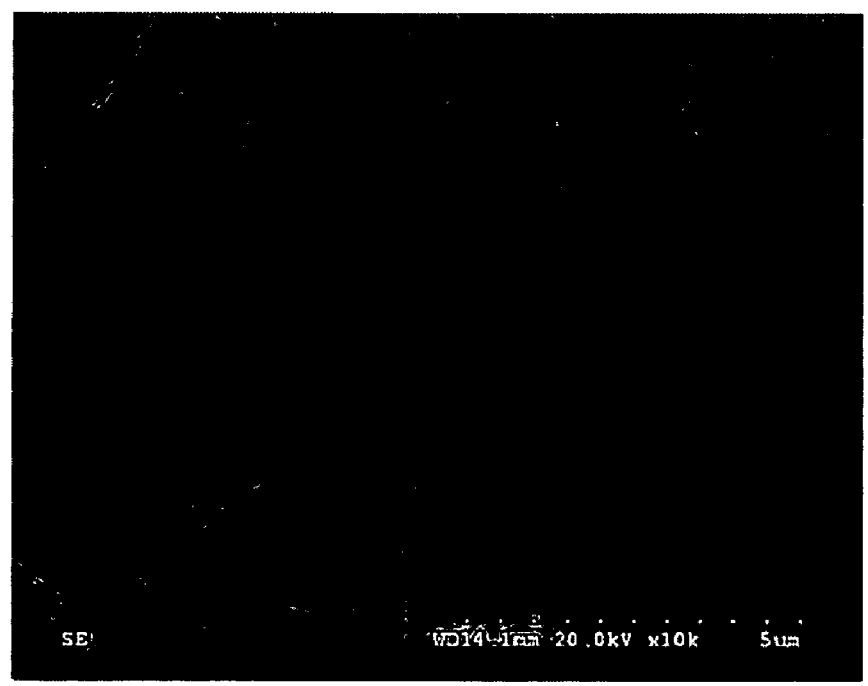

Scanning electron microscopy (SEM) images of the silicon nanowires are shown in FIGS. 5a and 5b.

As described above, although example embodiments have been disclosed for illustrative purposes, those skilled in the art will appreciate that various modifications, additions and substitutions are possible, without departing from the scope and spirit of example embodiments as disclosed in the accompanying claims.

What is claimed is:

1. A method for producing nanowires, comprising
   wet etching the surface of a silicon substrate to leave defect sites,
   exposing the wet-etched silicon substrate to deionized water or air to form an oxide layer thereon, and
   heating the resulting silicon substrate in a furnace while feeding a nanowire precursor into the furnace to grow silicon nanowires from silicon nuclei formed within the oxide layer.

2. The method of claim 1, wherein the oxide layer contains $SiO_x$ ($0<x<2$).

3. The method of claim 1, wherein the wet etching is carried out using an etching solution selected from the group consisting of NaOH solutions, aqueous acetic acid solutions, aqueous hydrofluoric acid solutions, and aqueous phosphoric acid solutions.

4. The method of claim 1, wherein the nanowire precursor is selected from the group consisting of $SiH_4$, $SiCl_4$, $SiH_2Cl_2$, and mixtures thereof.

5. The method of claim 1, wherein the heating is conducted at a temperature of about 400° C. to about 800° C.

6. The method of claim 1, wherein the nanowires are doped with an n-dopant or p-dopant.

7. The method of claim 1, wherein the nanowires have a p-n junction structure of n- and p-type doping regions.

* * * * *